United States Patent [19]
Freiermuth et al.

[11] Patent Number: 5,519,193
[45] Date of Patent: May 21, 1996

[54] METHOD AND APPARATUS FOR STRESSING, BURNING IN AND REDUCING LEAKAGE CURRENT OF ELECTRONIC DEVICES USING MICROWAVE RADIATION

[75] Inventors: Peter E. Freiermuth, Hyde Park, N.Y.; Kathleen S. Ginn, Shelburne, Vt.; Jeffrey A. Haley, Raleigh, N.C.; Susan J. Lamaire, Yorktown Heights; David A. Lewis, Carmel, both of N.Y.; Gavin T. Mills, Burlington; Timothy A. Redmond, Essex Junction, both of Vt.; Yuk L. Tsang, Hopewell Junction, N.Y.; Joseph J. Van Horn, Underhill, Vt.; Alfred Viehbeck, Fishkill; George F. Walker, New York, both of N.Y.; Jer-Ming Yang, Changhwa City, Taiwan; Clarence S. Long, Essex Junction, Vt.

[73] Assignee: International Business Machines Corporation, Armonk, N.Y.

[21] Appl. No.: 966,960

[22] Filed: Oct. 27, 1992

[51] Int. Cl.⁶ .............................. H05B 6/80; G01R 31/26
[52] U.S. Cl. .......................... 219/678; 219/704; 219/710; 437/174; 437/248; 148/DIG. 71
[58] Field of Search ..................... 219/10.55 M, 219/10.55 R, 678, 679, 704, 710; 148/DIG. 71; 437/170, 174, 173, 171, 172, 247, 248

[56] References Cited

U.S. PATENT DOCUMENTS

| | | | |
|---|---|---|---|
| 4,303,455 | 12/1981 | Splinter et al. | 148/1.5 |
| 4,474,625 | 10/1984 | Cohen et al. | 219/10.55 M |
| 4,490,183 | 12/1984 | Scovell | 219/10.55 M |
| 4,517,026 | 5/1985 | Inoue | 219/10.55 M |
| 4,667,076 | 5/1987 | Amada | 219/10.55 M |
| 4,704,576 | 11/1987 | Tributsch et al. | |
| 4,755,487 | 7/1988 | Scovell et al. | 437/247 |
| 4,912,742 | 3/1990 | Nath | 219/10.55 M |

FOREIGN PATENT DOCUMENTS

| | | |
|---|---|---|
| 0346166 | 12/1989 | European Pat. Off. . |
| 0405586 | 1/1991 | European Pat. Off. . |
| 0465858 | 1/1992 | European Pat. Off. . |
| 61-32418 | 2/1986 | Japan . |
| 61-43417 | 3/1986 | Japan . |
| 62-183552 | 8/1987 | Japan . |
| 63-25966 | 2/1988 | Japan . |
| 63-299086 | 12/1988 | Japan . |
| 4-265870 | 9/1992 | Japan . |

OTHER PUBLICATIONS

Buchta et al., "Microwave Heating for VLSI Processing", 22nd European Microwave Conf., 27 Aug. 1992, Espoo, Finland, pp. 34–36.

*Primary Examiner*—Philip H. Leung
*Attorney, Agent, or Firm*—Daniel P. Morris

[57] ABSTRACT

The described invention is directed to microwave methods for burning-in, electrical stressing, thermal stressing and reducing rectifying junction leakage current in fully processed semiconductor chips individually and at wafer level, as well as burning in and stressing semiconductor chip packaging substrates and the combination of a semiconductor chip mounted onto a semiconductor chip packaging substrate. Microwaves burn-in devices in a substantially shorter period of time than conventional burn-in techniques and avoid the need for special workpiece holders which are required by conventional stress and burn-in techniques. Additionally, microwave methods are described for reducing the leakage current of recitfying junctions, such as PN junctions and Schottky barrier diode junctions of semiconductor devices on fully processed semiconductor chips and wafers.

33 Claims, 1 Drawing Sheet

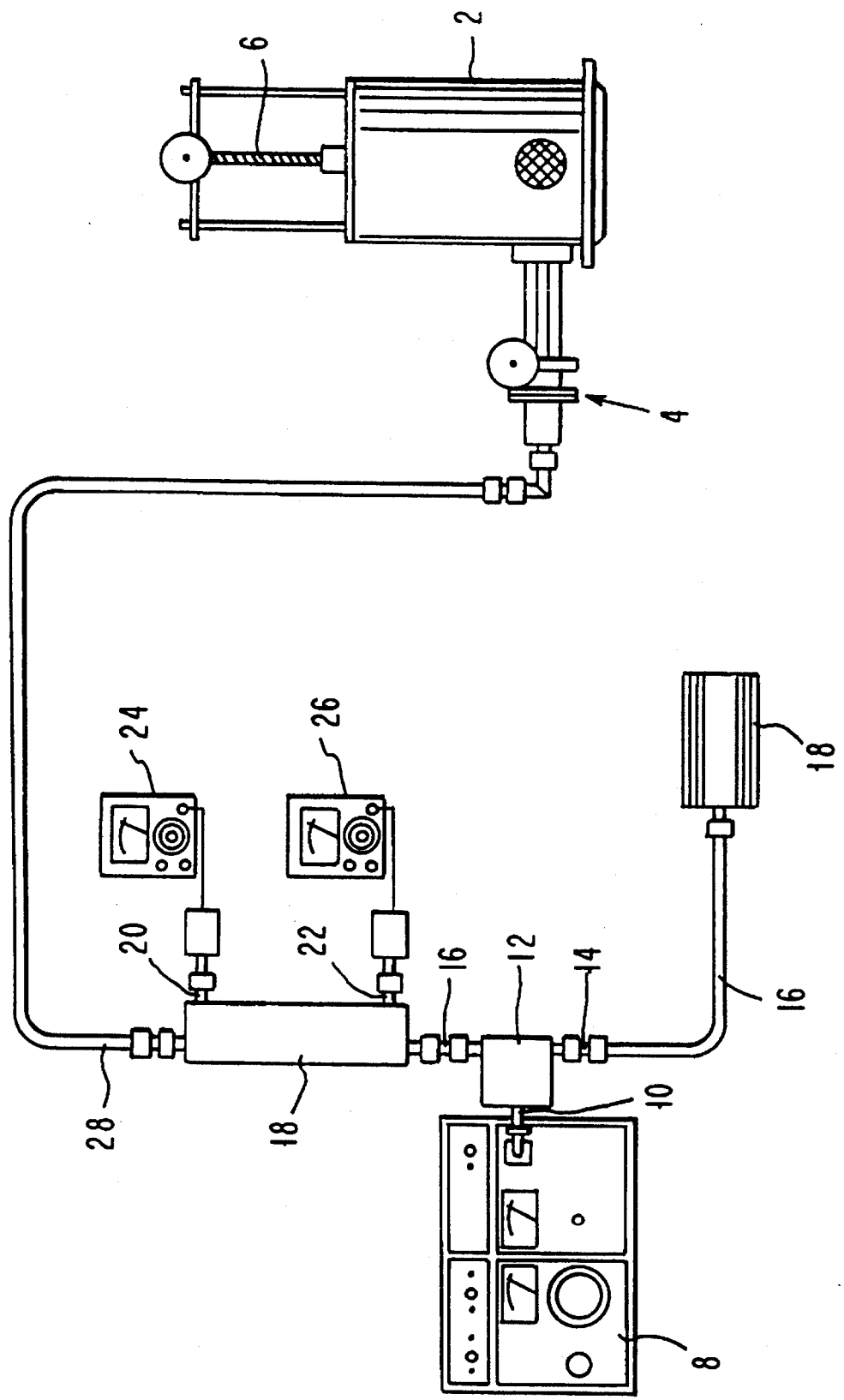

METHOD AND APPARATUS FOR STRESSING, BURNING IN AND REDUCING LEAKAGE CURRENT OF ELECTRONIC DEVICES USING MICROWAVE RADIATION

FIELD OF THE INVENTION

The present invention relates to methods of using microwave energy to stress and burn-in electronic devices and to reduce the leakage current of rectifying junctions in the electronic devices. More particularly, the electronic devices are semiconductor chips, semiconductor chip packaging substrates or the combination of a semiconductor chip electrically interconnected to a semiconductor chip packaging substrate. More particularly, the electronic devices are exposed to microwave energy or sufficient intensity to generate electrical currents and voltages within the circuits in the electronic devices of sufficient magnitude to burn in the electronic devices and to expose them to a reliability stress test which simulates the actual use of such devices in a product during a product lifetime. More particularly, the leakage current of a rectifying junction formed in a substantially fully crystallized semiconducting material is reduced by exposure to microwave radiation. More particularly, microwave stress and burn in is achieved in a fraction of the time of conventional reliability stress and burn in procedures. Most particularly, the devices are exposed to microwave energy in such a manner as to generate very fast thermal ramp rates and cycled a number of times to provide a larger thermal stress in a very short period.

BACKGROUND

In the microelectronics industry semiconductor product reliability has become increasingly competitive and more difficult to achieve. Recent experience has indicated that growing hardware complexity is creating added latent defects which present new, formidable challenges to microelectronics. Reliability failures generally occur within device cells by defect leakage, charge accumulation, electromigration and dielectric breakdown.

The reliability of electronic components for computers is increasingly more important as electronic devices become more sophisticated in response to the demands of computer users for increased performance. Increased hardware complexity creates more latent reliability exposures than previously experienced.

The commonly used techniques for exposing electronic devices to reliability stress tests and burn-in are to apply to external terminals of the devices forced currents or forced voltages usually with the electronic device held at an elevated temperature. Examples of external terminals are chip pads, substrate pads, pins or other outputs on modules containing chips mounted onto substrates. These techniques are labor intensive, therefore, they are high cost methods which substantially increase the cost of the manufactured electronic devices.

Commonly used stress tests and burn in of electronic devices require special fixtures for holding the electronic device under test and to provide the forced currents and voltages. In the case of semiconductor chips, each chip is typically mounted onto such a holder, stress tested, burned in, and thereafter the device must be removed from the holder for mounting onto a substrate to be used in a fabricated product. When a semiconductor chip packaging substrate, such a ceramic substrate, a polymer substrate, a printed circuit board, a tape automated bonding lead Frame and the like, are stress tested and burned-in, similar special holding structures must be used.

Burn-in and thermal cycling are stress application methods of causing reliability failures to manifest themselves in electronic devices in the factory prior to customer shipment through separate and distinct acceleration techniques.

During burn-in, defects are accelerated primarily by electrical stimuli (current and voltage), and secondarily by constant high temperature. The acceleration due to constant temperature —A(t)— is defined by the Arrhenious Model:

$$A(t) = e^{(h/k)(1/T_u - 1/T_s)}$$

where h= Activation Energy k= Boltzman's Constant ($8.625 \times 10^{-5}$ electrons/K(degrees)

$T_W$ is the use temperature $T_S$ is the stress temperature

The Acceleration due to electrical stimulus (voltage) is defined by:

$$A(v) = e^{\gamma(V_s - V_n)}$$

$\gamma$ is the fail distribution parameter which is derived through voltage acceleration modeling $V_S$ is the stress voltage $V_n$ is the nominal operating voltage Defects accelerated by burn-in typically are detected as shorts or opens.

During thermal cycling, defects are accelerated by temperature excursions causing failures to show themselves due to temperature coefficient of expansion (TCE) mismatches between the various materials used in device fabrication (such as between silicon and aluminum) and can be considered fatigue fails (or fail by a fatigue mechanism). This distinctly unique stress condition allows detection of distinctly unique defects that are not detectable via burn-in techniques.

Thermal cycle actuated fails typically are opens. The most prevalent example is 'seams'. Seams are reduction in the thickness of metal lines due primarily to an overly steep via causing a non-uniform deposition of metal at the steepest point. At the apex, the metal is very thin but conductive, however, the TCE mismatch during thermal cycling causes this very thin line to crack and become open. Seams cannot be accelerated by burn-in, since by definition, burn-in is done at uniform temperature and hence no TCE mismatch occurs.

Thermal cycling is also effective in finding packaging defects such as non-wet solder mounds, solder bumps or C4s and pads with low solder volume for the same reasons.

Applicants have discovered that the labor intensive processes currently used in the microelectronics industry to stress test and burn-in electronic devices can be avoided by exposing the electronic devices to microwave radiation.

Japanese laid-open unexamined patent application No. 63-25966 published Feb. 3, 1988 describes microwave annealing or recrystallization of crystal damage caused by ion implantation of a MISFET channel. There is a reduction in leakage current between the drain region and the channel component after the microwave annealing of the unannealed wafers, which only occurs at temperatures much greater than used in our invention. This patent application refers to a reduction in leakage current of an unannealed wafer which occurs even when the wafers are annealed by conventional means. There is no teaching, suggestion, motivation or incentive to apply microwaves to conventionally annealed wafers to further reduce leakage current.

Japanese laid-open unexamined patent application No. 61-43417 published Mar. 3, 1986, describes using microwaves for crystallization or re-crystallization of a semiconductor surface during the manufacture of a semiconductor device to anneal damage on a wafer surface produced by ion implantation. It is described therein that use of a conventional oven to anneal ion implant damage takes a long time. Moreover, a conventional oven cannot selectively heat only the semiconductor wafer surface to anneal a p-n junction close to the wafer surface. There is no teaching or suggestion of leakage current reduction, device stress test or device burn-in or thermal fatigue cycling.

Japanese laid-open patent application 63-299086 published Dec. 6, 1988 describes an apparatus for applying microwaves to a semiconductor device.

Japanese laid-open patent application 61-32418 published Feb. 15, 1986 is directed to a method of annealing semiconductor wafers using microwaves, such as to anneal crystal damage caused by ion implantation.

SUMMARY OF THE INVENTION

A principal object of the present invention is to provide a method for exposing an electronic device to microwave radiation to burn the device in, to electrically stress the device, to thermally stress the device and to reduce the leakage current of rectifying junctions in the device.

Another object of the present invention is achieve these results in a substantially short period of time.

A further object of the present invention is to achieve these results on fully processed electronic devices having metallization patterns thereon.

Yet a further object of the present invention is to reduce the leakage current of substantially fully annealed or recrystallized semiconductor devices by exposing the device to microwave radiation.

A broad aspect of the present invention is a method for exposing electronic devices to microwave radiation to burn-in, stress and thermally cycle the electronic devices and to reduce leakage current in rectifying junctions in the electronic devices.

In another more particular aspect of the present invention, the electronic devices are fully processed and have electrical conductive circuits.

In another more particular aspect of the present invention, the microwaves induce currents and voltages in the electrically conductive circuits in the electronic devices which stress and burn in the devices.

In another more particular aspect of the present invention, leakage current of rectifying electronic device junctions is reduced by exposing to microwave radiation a partially or fully processed electronic device with or without metallization patterns thereon wherein the semiconducting material of the electronic device is substantially fully crystallized.

BRIEF DESCRIPTION OF THE DRAWINGS

These and other objects, features and advantages of the present invention will become apparent upon a consideration of the following detailed description of the invention when read in conjunction with the drawing figure, in which:

The FIGURE shows a schematic diagram of a microwave apparatus useful to practice the present invention.

DETAILED DESCRIPTION

Most semiconductor chip failures result from problems in their top level metallization layers. State of the art very large scale integrated (VLSI) circuits have a plurality of thin film multilevel wiring layers on the active surface of the semiconductor chip. The current burn-in practice is to place the semiconductor chips mounted on a holder into an oven which is held at an elevated temperature. The semiconductor chips remain in the oven for as long as 15–25 hours. Voltages or currents are applied to the semiconductor chip I/O, generally through pins on the semiconductor chip holding apparatus as described herein above. Conventional chip burn-in is an accelerated failure test, which is both time consuming and costly. Moreover, using conventional techniques, since the voltages and currents can only be applied to the chip external terminals, the stresses which are applied to the chip circuits are limited by the chip design. As the metallization layer pattern widths become less than a half micron, the conventional burn-in methods may no longer be effective in identifying chips which may easily fail in the field.

Quite surprisingly, it has been Found that a discrete chip, a wafer of a plurality of chips, a discrete chip packaging substrate and a chip mounted onto a chip packaging substrate with and without pins or other external electrical connections which are shorted, grounded or electrically isolated can be burned in using microwave radiation in a fraction of the time required to stress and burn-in electronic devices using conventional techniques. Conventional burn-in techniques are generally described in "Burn-In—An Engineering Approach & Analysis of Burn-In Procedures", F. Jensen, N. E. Petersen, Wiley, 1982.

Accelerated failure testing of chips on the wafer level is possible utilizing microwave radiation according to the methods of the present invention. Partial opens and poor interconnections in the multilevel thin film wiring can be stressed for a period of seconds to minutes in a controlled manner by placing the wafer into a microwave field whose flux level and uniformity are carefully controlled. An apparatus for applying microwaves to fully processed semiconductor chips at wafer level and fully processed semiconductor chip packaging substrates or fully processed semiconductor chips mounted onto a semiconductor chip packaging substrates is described in copending U.S. patent application Ser. No. 07/551,716, to Cuomo et al., filed Jul. 11, 1990, entitled "Microwave Processing," which is assigned to the assignee of the present invention, the teaching of which is incorporated herein by reference. The input power to this system, as applied to the present invention, ranges from 100 watts to about 1 kilowatt. The flux level of the system can be carefully controlled, as described in copending U.S. patent application Ser. No. 07/782,841, to Hatzakis et al., filed Oct. 24, 1991, entitled "Radiation Control System," which is assigned to the assignee of the present invention, the teaching of which is incorporated herein by reference. The range of electromagnetic flux as applied to the present invention is from about 100W to about 450W.

Although the above is a capacitively coupled system, similar results are expected for an inductively coupled microwave or RF system.

According to the method of the present invention, chips at wafer level can be stressed quickly thereby improving the field reliability of chips and helping to model failure mechanisms. Moreover, the methods of the present invention permits identification of marginal or bad chips at the wafer level prior to module build. Therefore, the requirement of re-working chips on modules, that is removing chips which are subsequently found to be bad after being mounted onto a packaging substrate can be avoided and the operation of individually burning in chips can be eliminated.

Experiments have shown that wafers exposed from about 210° C. to about 285° C., for five minutes, at microwave ramp times, from about 2° C./min. to about 100° C./min, produced failures that correlate to current burn-in techniques for removing and identifying marginal chips.

The burn-in process stresses chips through elevation of temperature and voltage that induces weak devices and other structures to fail prior to being released to module build, card build, system build and ultimately to the field. The current process executes burn-in at the module level only. The prime objective is to remove potentially defective devices at the earliest part of the fabrication process, thereby, reducing the need for further work on defective chips. Significant cost reductions are also achieved by freeing up people and capital resources if bad chips and low yielding wafer lots are identified early.

It is believed that the microwaves induce currents and voltages in closed loop circuits in the electronic device being exposed. These induced currents and voltages simulate conventional stress burn-in.

The invention herein permits the microwave burn-in of chips at wafer level without altering existing product wafer structures and without the limitations of potentially having to discard the low yield wafers which may not be adaptable to mechanical wafer contact schemes using currently practiced burn-in techniques.

The following are exemplary experiments demonstrating microwave burn-in of chips.

Seven modules containing individual memory chips packaged in a standard j-lead configuration and encapsulated in plastic were tested and then exposed to microwave radiation at a frequency of 2.45 GHz from about 200 watts to about 460 watts from about 10 seconds to about 4 minutes. The results showed a correlation between microwave exposure time, power and device failure. The electrical test results were consistent with the types of failure and the failure rates expected from standard voltage and temperature burn-in using commonly used burn in techniques.

Additionally, five fully processed wafers were electrically tested and exposed to 2.45 GHz microwave radiation and were subsequently analyzed with the following results which is consistent with the results expected from conventional burn-in. Two wafers were exposed to 210° C. at 500 watts for five minutes at a ramp rate of 42° C. per minute. Two wafers were exposed to 250° C., 250 Watts for five minutes at a ramp rate of 30° C. per minute. One wafer was exposed to 285° C. 300 Watts for five minutes at a slow ramp rate of 20° C. per minute. The results correlated with the normal burn in pattern in quantity and types of failures. Additionally, some devices experienced healing, that is, became more functional.

The partial good (PG) devices which are inherently of lesser quality degraded to lower levels of functionality. Using conventional techniques for burn-in requires that burn-in time for a partially good chip be greater than the burn-in time for an all good (AG) chip. A partially good chip is a chip on which only a portion of the circuits and devices are functional. An all good chip is a chip on which all the circuits and devices are functional.

AC and DC fails accounted for the largest number of fails before the exposure to the microwaves. These fails increased after exposure. AC fails are performance fails which are functional at low speeds and defective at high speeds. DC Fails are functional or parametric fails, such as leakage fails, which fail at all speeds and application conditions.

In general, all failure types became larger, matching the burn-in types experienced using conventional burn-in techniques. Some typical burn-in types are static, dynamic and insitu Fails. Static burn in refers to the application of elevated temperature and power supply voltage with no stimulus to the receivers. Dynamic burn in adds stimulus conditions to the receivers. Dynamic burn in adds stimulus conditions to the receivers in addition to the elevated temperature and elevated voltage. Insitu burn in refers to all the conditions of dynamic burn in with the addition of monitoring the chip outputs, hence resulting in complete testing of the device at stress conditions (temperature and voltage), throughout the burn in cycle.

These measurements show that chips exposed to microwave radiation experience essentially the same failure types and mechanisms as results From aggressive temperature and voltage burn-in and tests using conventional burn-in techniques.

The figure shows a schematic diagram of microwave system useful to practice the present invention. Details of the apparatus shown in the figure as well as computer control of the apparatus of the figure can be found in the patent applications to Cuomo et al. and Hatzakis et al. incorporated herein above by reference. The workpiece is placed in microwave cavity 2 wherein the workpiece is exposed to microwaves by an antennae which is within the cavity 2. The antenna is controlled by antennae control means 4. The tuning of the microwave cavity is controlled by the antennae and by a ground plate, the position of which is adjustable by plate adjustment means 6. Microwaves are provided by microwave supply 8 such as model 42081 of Conversion Technology Corp. Output 10 of source 8 is fed into a three port circulator 12, such as Number 2620 of Ferrite Control Company. The three port circulator 12 has an output 14 which leads through cable 16, such as a type N cable into a dummy load 18, such as a NARDA 3668 BN load. Dummy load 18 is there to dissipate radiation reflected From the cavity 2 due to impedance mismatch due to the misplacement of antennae and the adjustable ground plate. Output 16 of the three port circulator 12 is fed into directional coupler 18, such as a NARDA 3043 B directional coupler. Directional coupler 18 has an output 20 and an output 22, each of which are fed into a power meter and sensor, such as Hewlett Packard HP 435, 24 and 26 respectively. One of the power meters 24 and 26 measures the power output from the microwave supply 8 and the other of the power meters 24 and 26 measures the reflected power from the workpiece in cavity 2. Output 28 from directional coupler 18 provides the microwave power to the antennae controlled by antennae control means 4.

In addition to burning in semiconductor chips individually or at wafer level, applicants have discovered that semiconductor chip packaging substrates, such as printed circuit boards, and metallized ceramic substrates can also be burned in using the same technique. In addition, applicants have discovered that semiconductor chips mounted onto semiconductor chip packaging substrates can be burned in simultaneously using the techniques of the present invention.

The mounted semiconductor chips can be singular, as in single chip modules or multichip modules. Further, in these structures, the pins can be (i) all electrically connected, (ii) only ground and power pins connected—signal pins electrically isolated or (iii) ground and power pins electrically grounded. Using these configurations, (i) thermal cycling can be specifically isolated from burn-in type mechanisms, (ii) higher microwave power levels can be utilized to accelerate heating rates without causing excessive electrical overload damage to devices especially drivers and receivers.

In the case of mounted semiconductor devices, the microwave power must be controlled below certain threshold limits where electrical overload of circuits occurs. This results in damage to the chip in excess of normal failures (accelerated or not) and is undesirable. Therefore, there is a process window for mounted chips within which accelerated burn in occurs.

In addition, applicants have discovered that the leakage current of a junction on a semiconductor device such as a PN junction or a Schottky barrier diode junction, can be decreased by the application of microwaves. Applicants have measured the leakage current of a rectifying junction, such as a PN junction such as the emitter base junction of a bipolar transistor or the collector base junction of a bipolar transistor or the source to channel junction of an FET transistor or the drain to channel junction of a FET transistor. These junctions have a specific measured leakage current before exposure to microwaves. When such devices are exposed to microwave radiation, such as between frequency of about 100 MHz to about 300 GHz, preferably from about 2 GHz to about 45 GHz, at a power level from about 100 watts to about 600 watts, for a time of from about 15 seconds to about 15 minutes, it is found that there is a decrease in the leakage current. Applicants have found that this leakage current reduction occurs when Fully processed semiconductor chips having substantially fully crystallized or recrystallized semiconductor material and having one or more levels of metallization thereon are exposed to microwaves as described herein.

When a bias is applied across a bipolar transistor, a current is formed across the emitter-base and base collector junctions. This has a well known relationship in ideal transistors. However, in real cases there are deviations at both the high and low applied voltage regions in both the Forward and reverse bias modes. At high applied voltage saturation occurs while at low voltage, the current flow is higher than predicted by the ideal relationship. This current enhancement is due to impurities, imperfections, etc. This current is referred to as a leakage current.

Quite surprisingly, applicants have discovered that when a fully processed semiconductor chip having metallization patterns thereon having substantially fully annealed or crystallized semiconducting material is exposed to microwave radiation, the leakage current of rectifying junctions such as PN junctions and Schottky junctions is reduced as compared to the unexposed junctions.

The leakage current limits the performance and yield of a chip having a plurality of transistors since the gain from each transistor may be different. This creates device and circuit tracking problems within the chip as the gain from two devices may not be the same. Hence, it is difficult to match the performance of these devices across the wafer resulting in the yield or performance being degraded as a result of poor quality transistors. In DRAMS, the leakage current limits the refresh time of the memory cells. As the leakage current decreases, the refresh time becomes longer, resulting in lower power consumption and reduced heat dissipation.

The cause of leakage current can be surface states, defects, etc., which, under stress could prove to be a reliability concern.

To ensure that the metallurgy of a wafer containing a plurality of semiconductor chips was not deleteriously affected by microwave radiation, the heating cycle and residual oxygen during the anneal cycle and to enable the use of an IR pyrometer to measure the wafer surface temperature, a thin film of polyimide was applied as an encapsulant to the active surface of the wafer. The polyimide film is not necessary to reduce the leakage current.

After five cycles, wherein each cycle consisting of linear ramp to 310° C. in 3 minutes and hold For one minute, the polyimide encapsulant was removed and the devices tested. In all but one case, the leakage current was observed to be substantially reduced to 50% of the value before microwave exposure for the lowest applied voltage. In the one case in which the decrease was not observed, the leakage current was similar to the values obtained after the remaining devices were exposed to the microwave radiation. These results are shown in the Table below wherein leakage current before and after microwave cycling are shown for each device tested For two different sized devices. The reductions measured are significant and real. The results observed are the same for both size devices.

TABLE

LEAKAGE CURRENT (IN pA) IN TRANSISTORS - 0.5 VOLTS

| Site Number | Before Microwave Exposure | After 5 cycles of microwave exposure 2.45 GHz 300 Watts for 45 min. each cycle |
|---|---|---|
| 1.5 × 1.5 μm² | Initial collector current | Collector current after exposure |
| 1 | 41 | 19 |
| 2 | 28.5 | 49 |
| 3 | 28 | 18 |
| 4 | 29.5 | 18 |
| 5 | 31.5 | 16.5 |
| 6 | 34.5 | 19.5 |
| 0.5 × 0.5 μm² SITE | Ic Initial | IC After Microwave |
| 1 | 36 | 10 |
| 2 | 6 | 7.5 |
| 3 | 31.5 | 8.5 |
| 4 | 107.5 | 10 |
| 5 | 7 | 5.5 |
| 6 | 13.5 | 11 |

Microwave exposure can also be used to accelerate defects associated with temperature excursions alone, in chips, wafers, packaging substrates and modules having chips mounted onto substrates. Silicon chips arc commonly mounted onto ceramic substrates, polymeric substrates, printed circuit boards in a flip-chip-configuration with solder mounds, or solder bumps, commonly referred to as C4s, electrically interconnecting chips pads and substrate pads. The thermal coefficient of expansion mismatch between the chip and substrate can stress the C4 joint. Microwaves can be used to heat up the assembly of chip and substrate to accelerate defects in the C4s. The assembly is placed in a chamber and exposed to microwave radiation using the techniques and apparatus described herein above. A single mode cavity is preferred. The temperature of the assembly is monitored, for example using a pyrometer. The microwave radiation is discontinued when the desired temperature is reached. The contents of the chamber arc cooled and the process is repeated up to 100 times. The microwave radiation can be between 100 MHz and 300 GHz, 50 watts and 600 watts for from 15 seconds to 15 minutes. For example, eight inch wafers were moved from room temperature (about 30° C.) to 200° C. in 20 seconds, the power was shut off and the wafer was permitted to cool to room temperature before repeating the cycle. For example, a module having a chip mounted onto a substrate was cooled to 10° C. and microwave heated to 100° C. in 20 seconds; the power was shut off and allowed to cool to room temperature.

The procedure works equally well for chips that are wire bonded to substrates or lead frames, however, the thermal cycle failure is not as important in this configuration.

In summary, the present invention is a method of exposing an electronic device to microwave radiation to burn-in the device, to electrically stress the device, to thermally stress the device and to reduce rectifying junction leakage current in junctions fabricated in substantially fully crystallized semiconducting material.

It is to be understood that the above described embodiments are simply illustrative of the principles of the invention. Various other modifications and changes may be devices by those of skill in the art which will embody the principles of the invention and Fall within the spirit and scope thereof.

We claim:

1. A method comprising the steps of:

providing a plurality of electronic devices;

exposing said electronic device to microwave radiation to stress and burn-in said electronic device to identify defective ones of said plurality of electronic devices.

2. The method of claim 1, wherein said microwave radiation has a frequency from about 100 MHz to about 300 GHz.

3. The method of claim 1, wherein said microwave radiation has a frequency of from about 2 GHz to about 45 GHz.

4. The method of claim 1, wherein said microwave radiation has power from about 50 to about 600 watts.

5. The method of claim 4, wherein said microwave radiation is single mode.

6. The method of claim 1, wherein said microwave radiation has frequency from about 100 MHz to about 300 GHz and power from about 50 to about 600 watts.

7. The method of claim 1, further including holding at least one of said electronic devices at a temperature from about 150° to about 450° C.

8. The method of claim 1, wherein at least one of said electronic devices is at said step of exposing for a time from about 15 seconds to about 15 minutes.

9. The method of claim 1, further including exposing each of said plurality of said electronic devices to said microwave radiation so that said electronic device is exposed to a temperature ramp from a first temperature to a hold temperature and wherein each of said plurality of electronic devices is held at said hold temperature for a predetermined length of time.

10. The method of claim 1, wherein there are a plurality of applications of said step of exposing to microwave radiation.

11. The method of claim 1, wherein said plurality of electronic devices are selected from the group consisting of a semiconductor chip, a semiconductor wafer, a semiconductor chip packaging substrate and a module containing a semiconductor chip electrically interconnected to a semiconductor chip packaging substrate.

12. The method of claim 1, wherein each of said plurality of electronic devices is a semiconductor chip having semiconductor devices electrically interconnected by metallization patterns.

13. The method of claim 12, wherein said semiconductor chip has a plurality of layers of metallization patterns.

14. The method of claim 1, wherein each of said plurality of said electronic devices is an integrated circuit packaging substrate having a plurality of layers of metallization patterns.

15. The method or claim 1, wherein each of said plurality 0f said electronic devices is a packaging substrate containing metallization patterns selected from the group consisting of a printed circuit board, a ceramic substrate, a metallized flexible polymer film, a silicon wafer, a glass-ceramic substrate and a glass.

16. The method of claim 1, wherein each of said plurality of said electronic devices is a semiconductor wafer having a plurality of semiconductor chips.

17. The method of claim I wherein said step of exposing to microwave radiation accelerates defects to failure within said plurality of said electronic devices.

18. The method of claim 1, wherein said step of exposing to microwave radiation heals defects within said plurality of said electronic devices.

19. The method of claim 1, wherein said step of exposing to microwave radiation decreases surface state concentrations on said plurality of said electronic devices.

20. The method of claim 1, wherein said step of exposing to microwave radiation induces currents and voltages in circuits on plurality of said electronic devices.

21. The method of claim 1, wherein there are a plurality of applications of said step exposing to microwave radiation.

22. The method of claim 1, wherein said stress is electrical stress.

23. The method of claim 1, wherein said stress is thermal stress.

24. The method of claim 1, wherein said electronic device is a semiconductor chip.

25. The method of claim 24, wherein said semiconductor chip is fully processed.

26. The method of claim 1, wherein said electronic device is an electronic package having a plurality of output electrical conductors.

27. The method of claim 26, wherein a part of said plurality of output electrical conductors are electrically interconnected.

28. The method of claim 26, wherein a part of said plurality of said output electrical conductors are grounded.

29. A method for burning-in a plurality of electronic devices selected from the group consisting of a semiconductor chip, a semiconductor wafer, a semiconductor chip packaging substrate and a module containing a semiconductor chip electrically interconnected to a semiconductor chip packaging substrate comprising the steps of:

exposing each of said plurality of said electronic devices to microwave radiation of frequency from about 100 MHz to about 300 GHz an to a power from about 50 watts to about 600 watts for a period of from about 15 seconds to about 15 minutes to identify defectives over of said plurality of electronic devices.

30. A method comprising the steps of:

exposing each of a plurality of electronic devices selected from the group consisting of an integrated chip, a packaging substrate and the combination of an integrated circuit chip electrically mounted to a packaging substrate to microwave radiation to identify defective ones or said plurality of said electronic devices;

each of said plurality of said electronic devices containing electrically conducting circuits comprising metallization patterns;

said microwave radiation inducing currents or voltages in said circuits.

31. The method of claim 30, wherein said circuits comprise closed electrically conductive paths.

32. A method of thermally cycling a plurality of electronic devices to identify defective ones of said plurality of said electronic devices comprising the steps of:

providing said plurality of said electronic device;

exposing said plurality of said electronic devices to microwave radiation to increase the temperature of said electronic device;

cooling said electronic device;

repeating said step of exposing; and repeating said step of cooling.

33. A method comprising the steps of:

providing a plurality of electronic devices; exposing each of said plurality of said electronic device to microwave radiation for the purpose selected from the group consisting of electrical stress, thermal stress, burn-in and leakage current reduction to identify defective ones of said plurality of said electronic devices.

\* \* \* \* \*